US011045910B2

(12) United States Patent
Schmitt et al.

(10) Patent No.: US 11,045,910 B2
(45) Date of Patent: Jun. 29, 2021

(54) METAL PASTE AND USE THEREOF FOR JOINING COMPONENTS

(71) Applicant: Heraeus Deutschland GmbH & Co. KG, Hanau (DE)

(72) Inventors: Wolfgang Schmitt, Rodgua (DE);
Thomas Krebs, Mombris (DE);
Michael Schäfer, Kunzell (DE);
Susanne K. Duch, Bruchköbel (DE);
Jens Nachreiner, Gelnhausen (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 329 days.

(21) Appl. No.: 15/580,750

(22) PCT Filed: Aug. 2, 2016

(86) PCT No.: PCT/EP2016/068372
§ 371 (c)(1),
(2) Date: Dec. 8, 2017

(87) PCT Pub. No.: WO2017/036704
PCT Pub. Date: Mar. 9, 2017

(65) Prior Publication Data
US 2018/0147673 A1 May 31, 2018

(30) Foreign Application Priority Data
Sep. 4, 2015 (EP) .................................... 15183796

(51) Int. Cl.
| | | |
|---|---|---|
| *B23K 35/02* | (2006.01) |
| *B22F 1/00* | (2006.01) |
| *B22F 7/06* | (2006.01) |
| *B23K 35/365* | (2006.01) |
| *H01L 23/00* | (2006.01) |
| *B22F 1/02* | (2006.01) |
| *B23K 35/34* | (2006.01) |
| *B23K 35/36* | (2006.01) |
| *B23K 35/30* | (2006.01) |
| *B23K 101/36* | (2006.01) |

(52) U.S. Cl.
CPC .......... *B23K 35/025* (2013.01); *B22F 1/0003* (2013.01); *B22F 1/0055* (2013.01); *B22F 1/0062* (2013.01); *B22F 1/0074* (2013.01); *B22F 1/025* (2013.01); *B22F 7/064* (2013.01); *B23K 35/3006* (2013.01); *B23K 35/34* (2013.01); *B23K 35/365* (2013.01); *B23K 35/3618* (2013.01); *H01L 24/29* (2013.01); *H01L 24/83* (2013.01); *B22F 2301/255* (2013.01); *B23K 2101/36* (2018.08); *H01L 2224/2928* (2013.01); *H01L 2224/29239* (2013.01); *H01L 2224/29247* (2013.01); *H01L 2224/29255* (2013.01); *H01L 2224/8384* (2013.01)

(58) Field of Classification Search
CPC .............. B23K 35/025; B23K 35/3006; B23K 35/365; B22F 1/0055; B22F 1/0074; B22F 7/064
USPC .......................................................... 419/9
See application file for complete search history.

(56) References Cited

U.S. PATENT DOCUMENTS

| | | | | |
|---|---|---|---|---|
| 2005/0219802 | A1* | 10/2005 | Kobayashi ........... | H01G 9/0032 361/523 |
| 2007/0206344 | A1* | 9/2007 | Naito ..................... | H01G 9/025 361/523 |
| 2011/0290863 | A1 | 12/2011 | Kajiwara et al. | |
| 2012/0153011 | A1* | 6/2012 | Schafer ................. | B22F 1/0062 228/248.1 |
| 2014/0026953 | A1* | 1/2014 | Zhang ............. | H01L 31/022425 136/256 |
| 2014/0220732 | A1* | 8/2014 | Liu .................. | H01L 31/022425 438/98 |
| 2016/0082512 | A1 | 3/2016 | Schafer et al. | |

FOREIGN PATENT DOCUMENTS

| | | |
|---|---|---|
| CN | 101431038 A | 5/2009 |
| CN | 102386149 A | 3/2012 |
| CN | 103008910 A | 4/2013 |
| CN | 103170617 A | 6/2013 |
| CN | 104755572 A | 7/2015 |
| DE | 102009000192 A1 | 7/2010 |
| JP | H08161931 * | 6/1996 |
| JP | H-08161931 | 6/1996 |
| JP | 2009084634 A * | 4/2009 |
| KR | 20010079360 A * | 8/2001 |
| WO | WO-2011026623 A1 | 3/2011 |

OTHER PUBLICATIONS

International Search Report issued in PCT/EP2016/068372 dated Oct. 25, 2016.

* cited by examiner

*Primary Examiner* — Melissa S Swain
(74) *Attorney, Agent, or Firm* — Blank Rome LLP

(57) ABSTRACT

The invention relates to a metal paste, containing (A) 75 to 90% by weight of copper and/or silver particles that are provided with a coating containing at least one organic compound, (B) 5 to 20% by weight of an organic solvent, and (C) 2 to 20% by weight of at least one type of metal particles different from the particles of (A) and having an average particle size (d50) in the range of 0.2 to 10 μm. The metal particles of component (C) are selected from the group consisting of molybdenum particles and nickel core-silver shell particles with a silver content of 10 to 90% by weight.

13 Claims, No Drawings

METAL PASTE AND USE THEREOF FOR JOINING COMPONENTS

This application is a national stage of International Patent Application No. PCT/EP2016/068372, filed Aug. 2, 2016, which claims the benefit of European Patent Application 15183796.0, filed Sep. 4, 2015, each of which is hereby incorporated by reference in its entirety.

TECHNICAL FIELD

The present invention relates to a metal paste, and to a method for the connecting of components, in which said metal paste is used.

BACKGROUND

In power and consumer electronics, the connecting of components, such as LEDs or very thin silicon chips that are highly sensitive to pressure and temperature, is particularly challenging.

For this reason, said pressure- and temperature-sensitive components are often connected to each other by means of gluing. However, adhesive technology is associated with a disadvantage in that it produces contact sites between the components that comprise only insufficient heat conductivity and/or electrical conductivity.

In order to solve this problem, the components to be connected are often subjected to sintering. Sintering technology is a very simple method for connecting components in stable manner.

It is known in power electronics to use metal pastes in a sintering process to connect components. For example, WO2011/026623 A1 discloses a metal paste containing 75 to 90% by weight (percent by weight) of at least one metal that is present in the form of particles that comprise a coating that contains at least one organic compound, 0 to 12% by weight of at least one metal precursor, 6 to 20% by weight of at least one solvent, and 0.1 to 15% by weight of at least one sintering aid, as well as the use of said metal preparation to connect components by means of a sintering method.

DE 10 2009 000 192 A1 discloses sintering materials that can be used in a sintering process for the connecting of components and contain organically-coated copper, silver and/or gold particles as structural particles and non-organically-coated (uncoated) metallic and/or ceramic auxiliary particles. Referring to metallic auxiliary particles, it is noted that these can be provided to be made from the same material as the structural particles (albeit without organic coating).

DETAILED DESCRIPTION

It is the object of the invention to provide a sintering method for the connecting of components in stable manner. The method is to be used to produce contact sites of low porosity and high electrical and thermal conductivity between the components to be connected. The sintering method is to be suitable for stably connecting components both under pressure sintering conditions and in pressure-less sintering. The sintering connections produced with the method, in the form of sintering layers (sintered layers) provided between the connected components, should not become brittle and should not or hardly form internal mechanical tension even after sustained temperature stress as can occur under the normal conditions of use. Brittleness and mechanical tension in a sintering layer that connects components weaken the strength of said connection or might even destroy it, which is a problem of special import in the connecting of large-surfaced components, for example large-surfaced heat sinks or large-surfaced chips. Examples of large-surfaced components include those having a contact surface area of >16 mm$^2$, for example in the range of >16 to 12,000 mm$^2$. Examples include rectangular components whose rectangular contact surface has an edge length of >4 mm each, whereby the longer edge can, for example, be up to 150 mm in length. It is another object of the present invention to provide a metal paste that is well-suited for implementing said sintering method.

The invention relates to a method for the connecting of components, which comprises providing (a) a sandwich arrangement that comprises at least (a1) one component 1, (a2) one component 2, and (a3) a metal paste that is situated between component 1 and component 2, and (b) sintering the sandwich arrangement, whereby the metal paste comprises (A) 75 to 90% by weight copper and/or silver particles that comprise a coating that contains at least one organic compound, (B) 5 to 20% by weight organic solvent, and (C) 2 to 20% by weight of at least one type of metal particles that are different from particles (A) and have a mean particle size (d50) in the range of 0.2 to 10 μm, whereby the metal particles of component (C) are selected from the group consisting of molybdenum particles and nickel core-silver jacket particles with a silver content of 10 to 90% by weight.

The invention further relates to a metal paste that comprises (A) 75 to 90% by weight copper and/or silver particles that comprise a coating that contains at least one organic compound, (B) 5 to 20% by weight organic solvent, and (C) 2 to 20% by weight of at least one type of metal particles that are different from particles (A) and have a mean particle size (d50) in the range of 0.2 to 10 μm, whereby the metal particles of component (C) are selected from the group consisting of molybdenum particles and nickel core-silver jacket particles with a silver content of 10 to 90% by weight.

The term "mean particle size", as used in the description and claims, shall be understood to refer to the mean primary particle diameter ($d_{50}$) that can be determined by means of laser diffraction. Laser diffraction measurements can be carried out with an appropriate particle size measuring device, for example a Mastersizer 3000 made by Malvern Instruments.

The metal paste according to the invention contains, as component (A), 75 to 90% by weight, preferably 77 to 89% by weight, more preferably 78 to 87% by weight, and even more preferably 78 to 86% by weight, copper and/or silver particles comprising a coating that contains at least one organic compound. The weights given presently include the weight of the coating compounds situated on the particles.

The term "copper and/or silver particles (A)" shall be understood to include particles consisting of the pure metals (purity at least 99.9% by weight) as well as alloys containing up to 10% by weight of at least one other alloy metal. Examples of suitable alloy metals are copper, silver, gold, nickel, palladium, platinum, and aluminium.

Silver particles, in particular those made of pure silver, are preferred as component (A).

The copper and/or silver particles (A) can be of different shapes. They can be present, for example, in the form of flakes or be of a spherical (ball-like) shape. According to a particularly preferred embodiment, they take the shape of flakes. However, this does not exclude a minor fraction of the copper and/or silver particles employed being of different shape. However, preferably at least 70% by weight, more preferably at least 80% by weight, even more preferably at least 90% by weight or 100% by weight, of the copper and/or silver particles are present in the form of flakes.

The copper and/or silver particles are coated.

The term "coating of particles" shall be understood to refer to a firmly adhering layer on the surface of particles.

The coating of the copper and/or silver particles contains at least one type of coating compounds.

Said coating compounds are organic compounds.

The organic compounds serving as coating compounds are carbon-containing compounds that prevent the copper and/or silver particles from agglomerating.

According to a preferred embodiment, the coating compounds bear at least one functional group. Conceivable functional groups include, in particular, carboxylic acid groups, carboxylate groups, ester groups, keto groups, aldehyde groups, amino groups, amide groups, azo groups, imide groups or nitrile groups. Carboxylic acid groups and carboxylic acid ester groups are preferred functional groups. The carboxylic acid group can be deprotonated.

The coating compounds with at least one functional group preferably are saturated, mono-unsaturated or multi-unsaturated organic compounds.

Moreover, said coating compounds with at least one functional group can be branched or non-branched.

The coating compounds with at least one functional group preferably comprise 1 to 50, more preferably 2 to 24, even more preferably 6 to 24, and yet more preferably 8 to 20 carbon atoms.

The coating compounds can be ionic or non-ionic.

It is preferable to use free fatty acids, fatty acid salts or fatty acid esters as coating compounds.

The free fatty acids, fatty acid salts, and fatty acid esters preferably are non-branched.

Moreover, the free fatty acids, fatty acid salts, and fatty acid esters preferably are saturated.

Preferred fatty acid salts include the ammonium, monoalkylammonium, dialkylammonium, trialkylammonium, aluminium, copper, lithium, sodium, and potassium salts.

Alkyl esters, in particular methyl esters, ethyl esters, propyl esters, and butyl esters, are preferred esters.

According to a preferred embodiment, the free fatty acids, fatty acid salts or fatty acid esters are compounds with 8 to 24, more preferably 8 to 18, carbon atoms.

Preferred coating compounds include caprylic acid (octanoic acid), capric acid (decanoic acid), lauric acid (dodecanoic acid), myristic acid (tetradecanoic acid), palmitic acid (hexadecanoic acid), margaric acid (heptadecanoic acid), stearic acid (octadecanoic acid), arachinic acid (eicosanoic acid/icosanoic acid), behenic acid (do-cosanoic acid), lignoceric acid (tetracosanoic acid) as well as the corresponding esters and salts.

Particularly preferred coating compounds include dodecanoic acid, octadecanoic acid, aluminium stearate, copper stearate, sodium stearate, potassium stearate, sodium palmitate, and potassium palmitate.

The coating compounds can be applied to the surface of the copper and/or silver particles (A) by means of conventional methods that are known from the prior art.

It is possible, for example, to slurry the coating compounds, in particular the stearates or palmitates mentioned above, in solvents and to triturate the slurried coating compounds together with the copper and/or silver particles in ball mills. After trituration, the copper and/or silver particles coated with the coating compounds are dried and then dust is removed.

Preferably, the fraction of organic compounds, in particular the fraction of compounds selected from the group consisting of free fatty acids, fatty acid salts, and fatty acid esters, relative to the entire coating is at least 60% by weight, more preferably at least 70%, even more preferably at least 80% by, yet more preferably at least 90% by weight, in particular at least 95% by weight, at least 99% by weight or 100% by weight.

The fraction of the coating compounds, preferably of the coating compounds selected from the group consisting of free fatty acids, fatty acid salts, and fatty acid esters, is <5% by weight, for example 0.01 to 2% by weight, preferably 0.3 to 1.5% by weight, relative to the weight of the coated copper and/or silver particles.

The degree of coating, defined as the ratio of the mass of coating compounds and the surface area of the copper and/or silver particles, preferably is 0.00005 to 0.03 g, more preferably 0.0001 to 0.02 g of coating compounds per square metre ($m^2$) of surface area of the copper and/or silver particles.

The metal paste according to the invention contains, as component (B), 6 to 20% by weight, preferably 7 to 18% by weight, more preferably 8 to 17% by weight, and yet more preferably 10 to 15% by weight, organic solvent, i.e. an organic solvent or a mixture of at least two organic solvents.

The organic solvent or solvents (B) is/are organic solvent(s) that is/are used commonly for metal pastes. Examples include terpineols, N-methyl-2-pyrrolidone, ethylene glycol, dimethylacetamide, 1-tridecanol, 2-tridecanol, 3-tridecanol, 4-tridecanol, 5-tridecanol, 6-tridecanol, isotridecanol, with the exception of a methyl subsitution on the penultimate C-atom, unsubstituted 1-hydroxy-C16-C20-alkanes such as 16-methylheptadecan-1-ol, dibasic esters (preferably dimethylesters of glutaric, adipic or succinic acid or mixtures thereof), glycerol, diethylene glycol, triethylene glycol, and aliphatic hydrocarbons, in particular saturated aliphatic hydrocarbons, having 5 to 32 C-atoms, more preferably 10 to 25 C-atoms, and even more preferably 16 to 20 C-atoms. Said aliphatic hydrocarbons are being marketed for example by Exxon Mobil by the brand name Exxsol™ D140 or by the brand name Isopar M™.

It is essential to the invention that the metal paste contains, as component (C), 2 to 20% by weight of at least one type of metal particles that are different from particles (A) and have a mean particle size (d 50) in the range of 0.2 to 10 μm, whereby the metal particles of component (C) a selected from the group consisting of molybdenum particles and nickel core-silver jacket particles having a silver content of 10 to 90% by weight, preferably 15 to 30% by weight, in particular 25% by weight.

The particles forming component (C) are different from the copper and/or silver particles (A). They are either molybdenum particles or nickel core-silver jacket particles [silver-coated (-enveloped) nickel particles] with a silver content of 10 to 90% by weight, preferably 15 to 30% by weight, in particular 25% by weight or combinations of molybdenum particles and nickel core-silver jacket particles with a silver content of 10 to 90% by weight, preferably 15 to 30% by weight, in particular 25% by weight. In other words, the silver jackets of the nickel core-silver jacket particles account for 10 to 90% by weight, preferably 15 to 30% by weight, in particular 25% by weight of the total weight of the nickel core-silver jacket particles.

In particular, the particles (C) comprise neither flakes nor needles, specifically they comprise a shape factor in the range of, for example, 1 to 3, preferably 1 to 2.

The term, "shape factor", used presently refers to the shape of particles and means the ratio of the largest and smallest longitudinal extension of a particle. It can be determined through analysis of micrographs by measuring the dimensions of a statistically reasonable number of particles, for example 2,500 to 3,000 individual particles. For example, an optical microscope, at 5,000-full magnification, coupled to an automatic image analysis system can be used for this purpose.

Particles comprising a shape factor in the specified range of 1 to 3 or 1 to 2 are characterised, for example, by having a spherical shape (shape factor 1), an essentially spherical shape, an elliptical or egg shape, an irregular, but compact shape, the shape of a so-called coin, etc., but in any case a shape that deviates from that of platelets (flakes) or needles. The surface of the particles (C) can be smooth or irregular, for example rough or grated.

In one embodiment, the nickel core-silver jacket particles forming the component (C) do not have a coating.

The metal paste according to the invention can contain 0 to 12% by weight, preferably 0.1 to 12% by weight, more preferably 1 to 10% by weight, and even more preferably 2 to 8% by weight of at least one metal precursor (D).

In the scope of the invention, a metal precursor shall be understood to mean a compound that contains at least one metal. Preferably, said compound decomposes at temperatures below 200° C. while releasing a metal. Accordingly, the use of a metal precursor in the sintering process is preferably associated with the in situ production of a metal. It is easy to determine whether a compound is a metal precursor. For example, a paste containing a compound to be tested can be deposited on a substrate having a silver surface followed by heating to 200° C., and maintaining this temperature for 20 minutes. Then, it is tested whether or not the compound to be tested decomposed to form a metal under these conditions. For this purpose, for example, the content of the metal-containing paste components can be weighed before the test to calculate the theoretical mass of metal. After the test, the mass of the material deposited on the substrate is determined by gravimetric methods. If the mass of the material deposited on the substrate is equal to the theoretical mass of metal, taking into account the usual measuring inaccuracy, the tested compound is a metal precursor.

According to a preferred embodiment, the metal precursor is a metal precursor that can be decomposed endothermically. A metal precursor that can be decomposed endothermically shall be understood to be a metal precursor whose thermal decomposition, preferably in a protective gas atmosphere, is an endothermic process. Said thermal decomposition is to be associated with the release of metal from the metal precursor.

The metal precursor preferably comprises, as metal, at least one element selected from the group consisting of copper, silver, gold, nickel, palladium, and platinum, in particular of copper and silver.

It can be preferable to use, as metal precursor, endothermically decomposable carbonates, lactates, formates, citrates, oxides or fatty acid salts, preferably fatty acid salts having 6 to 24 carbon atoms, of the metals specified above.

Silver carbonate, silver lactate, silver formate, silver citrate, silver oxide (for example AgO or $Ag_2O$), copper lactate, copper stearate, copper oxide (for example $Cu_2O$ or CuO) are used as metal precursor in specific embodiments.

According to a particularly preferred embodiment, silver carbonate and/or silver oxide is used as metal precursor.

The metal precursor, if present in the metal paste, is preferably present in the form of particles.

The metal precursor particles can take the shape of flakes or a spherical (ball-like) shape. Preferably, the metal precursor particles are present in the form of flakes.

Moreover, the metal paste can contain 0 to 10% by weight, preferably 0 to 8% by weight, of at least one sintering aid (E). Examples of sintering aids include organic peroxides, inorganic peroxides, and inorganic acids, such as are described, for example, in WO 2011/026623 A1.

In addition to ingredients (A) to (E) illustrated above, the metal paste according to the invention can contain 0 to 15% by weight, preferably 0 to 12% by weight, more preferably 0.1 to 10% by weight, of one or more further ingredients (F). Said further ingredients can preferably be ingredients that are used commonly in metal pastes. The metal paste can contain, for example, as further ingredients, dispersion agents, surfactants, de-foaming agents, binding agents, polymers such as cellulose derivatives, for example methylcellulose, ethylcellulose, ethylmethylcellulose, carboxycellulose, hydroxypropylcellulose, hydroxyethylcellulose, hydroxymethylcellulose and/or viscosity-controlling (rheological) agents.

The sum of the % by weight fractions specified for ingredients (A) to (F) adds up, for example, to 100% by weight relative to the metal paste according to the invention, i.e. prior to the application thereof. Accordingly, the metal paste according to the invention can be produced by mixing ingredients (A) to (F). Devices known to a person skilled in the art, such as stirrers and three-roller mills, can be used in this context.

The metal paste according to the invention can be used, in particular, as sintering paste, i.e. in a sintering process. Sintering shall be understood to mean the connecting of two or more components by heating without the copper and/or silver particles (A) reaching the liquid phase.

The sintering method implemented through the use of the metal paste according to the invention can be implemented while applying pressure or without pressure. Being able to implement the sintering method without pressure means that a sufficiently firm connection of components is attained despite foregoing the application of pressure. Being able to implement the sintering process without pressure allows pressure-sensitive, for example fragile, components or components with a mechanically sensitive micro-structure to be used in the sintering method. Electronic components that have a mechanically sensitive micro-structure suffer electrical malfunction when exposed to inadmissible pressure.

Connecting at least two components shall be understood to mean attaching a first component on a second component. In this context, "on" simply means that a surface of the first component is being connected to a surface of the second component regardless of the relative disposition of the two components or of the arrangement containing the at least two components.

In the scope of the invention, the term, component, is preferred to comprise single parts. Preferably, said single parts cannot be disassembled further.

According to specific embodiments, the term, components, refers to parts that are used in electronics.

Accordingly, components can, for example, be diodes, LEDs (light-emitting diodes), DCB (direct copper bonded) substrates, lead frames, dies, IGBTs (insulated-gate bipolar transistors), ICs (integrated circuits), sensors, heat sink elements (preferably aluminium heat sink elements or copper heat sink elements) or other passive components (such as resistors, capacitors or coils). As is evident from the specification of the object of the invention, components can specifically comprise large-surfaced components, as is described above.

The components to be connected can be identical or different components.

Embodiments of the invention relate to the connecting of LED to lead frame, LED to ceramic substrate, of dies, diodes, IGBTs or ICs to lead frames, ceramic substrates or DCB substrates, of sensor to lead frame or ceramic substrate.

The components, for example at least one of components 1 and 2 can—in as far as they do not consist of metal anyway—comprise at least one metal contact surface, for example in the form of a metallisation layer, by means of which the above-mentioned sandwich arrangement is effected in the scope of the method according to the invention. Said metallisation layer preferably is part of the component. Preferably, said metallisation layer is situated on at least one surface of the component.

Preferably, the connecting of the components by means of the metal paste according to the invention is effected by means of said metallisation layer or layers.

The metallisation layer can comprise pure metal. Accordingly, it can be preferred for the metallisation layer to comprise at least 50% by weight, more preferably at least 70% by weight, even more preferably at least 90% by weight or 100% by weight of pure metal. The pure metal is selected, for example, from the group consisting of aluminium, copper, silver, gold, palladium, and platinum.

On the other hand, the metallisation layer can just as well comprise an alloy. The alloy of the metallisation layer preferably contains at least one metal selected from the group consisting of aluminium, silver, copper, gold, nickel, palladium, and platinum.

The metallisation layer can just as well have a multi-layer structure. Accordingly, it can be preferred that at least one surface of the components to be connected comprises a metallisation layer made of multiple layers that comprise the pure metals and/or alloys specified above.

In the method according to the invention, at least two components are being connected to each other through sintering.

For this purpose, the two components are first made to contact each other. The contacting is effected by means of the metal paste according to the invention in this context. For this purpose, an arrangement is provided, in which metal paste according to the invention is situated between each two of the at least two components.

Accordingly, if two components, i.e. component 1 and component 2, are to be connected to each other, the metal paste according to the invention is situated between component 1 and component 2 before the sintering process. On the other hand, it is conceivable to connect more than two components to each other. For example three components, i.e. component 1, component 2, and component 3, can be connected to each other in appropriate manner such that component 2 is situated between component 1 and component 3. In this case, the metal paste according to the invention is situated both between component 1 and component 2 as well as between component 2 and component 3.

The individual components are present in a sandwich arrangement and are being connected to each other. Sandwich arrangement shall be understood to mean an arrangement, in which two components are situated one above the other with the two components being arranged essentially parallel with respect to each other.

The arrangement of at least two components and metal paste according to the invention, whereby the metal paste is situated between two components of said arrangement, can be produced according to any method known according to the prior art.

Preferably, firstly, at least one surface of a component 1 is provided with the metal paste according to the invention. Then, another component 2 is placed by one of its surfaces on the metal paste that has been applied to the surface of component 1.

The application the metal paste according to the invention onto the surface of the component can take place by means of conventional processes, for example by means of printing processes such as screen printing or stencil printing. On the other hand, the metal paste according to the invention can be applied just as well by dispensing technique, by means of pin transfer or by dipping.

Following the application of the metal paste according to the invention, it is preferable to contact the surface of said component that has been provided with the metal paste to a surface of the component to be connected thereto by means of the metal paste. Accordingly, a layer of the metal paste according to the invention is situated between the components to be connected.

Preferably, the thickness of the wet layer between the components to be connected is in the range of 20 to 100 µm. In this context, thickness of the wet layer shall be understood to mean the distance between the opposite surfaces of the components to be connected prior to drying, if any, and prior to sintering. The preferred thickness of the wet layer depends on the method selected for applying the metal paste. If the metal paste is applied, for example, by means of a screen printing method, the preferred thickness of the wet layer can be 20 to 50 µm. If the metal paste is applied by means of stencil printing, the preferred thickness of the wet layer can be in the range of 20 to 100 µm. The preferred thickness of the wet layer in the dispensing technique can be in the range of 20 to 100 µm.

As an option, a drying step is introduced prior to the sintering, i.e. the organic solvent is removed from the applied metal paste. According to a preferred embodiment, the fraction of organic solvent in the metal paste after drying is, for example, 0 to 5% by weight with respect to the original fraction of organic solvent in the metal paste according to the invention, i.e. in the metal paste ready for application. In other words, according to said preferred embodiment, for example 95 to 100% by weight of the organic solvent that is originally present in the metal paste according to the invention are removed during drying.

If drying takes place in a sintering process without pressure, the drying can proceed after producing the arrangement, i.e. after contacting the components to be connected. If drying takes place in a sintering process involving the application of pressure, the drying can just as well proceed after application of the metal paste onto the at least one surface of the component and before contacting to the component to be connected.

Preferably, the drying temperature is in the range of 100 to 150° C.

Obviously, the drying time depends on the composition of the metal paste according to the invention and on the size of the connecting surface of the arrangement to be sintered. Common drying times are in the range of 5 to 45 minutes.

The arrangement consisting of the at least two components and metal paste situated between the components is finally subjected to a sintering process.

The actual sintering takes place at a temperature of, for example, 200 to 280° C. in a process either with or without pressure.

The process pressure in pressure sintering is preferably less than 30 MPa and more preferably less than 5 MPa. For example, the process pressure is in the range of 1 to 30 MPa and more preferably is in the range of 1 to 5 MPa.

The sintering time is, for example, in the range of 2 to 60 minutes, for example in the range of 2 to 5 minutes in pressure sintering and for example in the range of 30 to 60 minutes in sintering without pressure.

The sintering process can take place in an atmosphere that is not subject to any specific limitations. Accordingly, on the one hand, the sintering can take place in an atmosphere that contains oxygen. On the other hand, it is feasible just as well that the sintering takes place in an oxygen-free atmosphere. In the scope of the invention, an oxygen-free atmosphere shall be understood to mean an atmosphere whose oxygen content is no more than 10 ppm, preferably no more than 1 ppm, and even more preferably no more than 0.1 ppm.

The sintering takes place in a conventional suitable apparatus for sintering, in which the above-mentioned process parameters can be set.

Aside from meeting basic requirements such as shear strength, the compounds produced from a metal paste according to the invention and/or in the method according to the invention using a metal paste according to the invention, being present in the form of sintering layers connecting components, are characterised by their advantageous behaviour even after long-term temperature stress at 200° C. for, for example, 100 or 200 hours. As a result, there is little brittling and formation of only a low degree of internal tension. The brittling behaviour and the degree of the formation of internal tension can be investigated in the laboratory using free sintering layers. For this purpose, free sintering layers, for example 2.5 cm in length, 1 cm in width and 100 μm in thickness, can be produced by applying a metal paste to be tested onto an oxidised copper foil by stencil printing, sintering at elevated temperature in common manner, and subsequently detaching it from the oxidised copper foil. The oxide layer of the oxidised copper film serves for simple release while the sintering layer is being detached. The free sintering layers thus produced can then be tested, before and after a long-term temperature stress, for example at 200° C. for 100 or 200 hours, for their brittling behaviour by determining the modulus of elasticity and the warpage or bowing, which is a measure for the formation of internal tension. The modulus of elasticity E can be determined from the bending force X, determined in a bending test using a bending device with two support rollers and one bending die in accordance with DIN EN ISO 7438:2012-03, according to the following formula:

$$E=(l^3 \cdot X):(4D \cdot b \cdot a^3)$$

l: Span, in mm
X: Force in kN, determine at the end of the determination of the flexural modulus (at 0 kN at the start of the determination of the flexural modulus)
D: Sagging, in mm
b: Sample width, in mm
a: Sample thickness, in mm In this context, higher modules of elasticity indicate higher brittleness; in other words, the smaller the increase of the modulus of elasticity of a sample body of the sintering layer after long-term temperature stress as compared to the starting value of an unstressed sample body of the sintering layer, the lower the undesired tendency to show brittleness.

The determination of the curvature after long-term temperature stress can take place as a multi-point measurement in accordance with DIN EN ISO 25178-6:2010-06 using confocal microscopy (see item 3.3.6 of the standard), whereby a low curvature indicates a low formation of internal tension.

The invention is illustrated through examples in the following, though these may not be construed such as to limit the invention in any way or form.

EXAMPLES

1. Production of Metal Pastes

Initially, reference pastes P1-P7 and inventive metal pastes P8-P13 were produced by mixing the individual ingredients according to the following table. All amounts given are in units of % by weight.

| Reference pastes | P1 | P2 | P3 | P4 | P5 | P6 | P7 |
|---|---|---|---|---|---|---|---|
| Silver particles | 85 | 75 | 75 | 75 | 80 | 70 | 75 |
| α-Terpineol | 14.8 | 14.8 | 14.8 | 14.8 | 14.8 | 14.8 | 14.8 |
| Ethylcellulose | 0.2 | 0.2 | 0.2 | 0.2 | 0.2 | 0.2 | 0.2 |
| Aluminium oxide | 0 | 10 | 0 | 0 | 0 | 0 | 0 |
| Tungsten | 0 | 0 | 10 | 0 | 0 | 0 | 0 |
| Aluminium nitride | 0 | 0 | 0 | 10 | 5 | 10 | 0 |
| Titanium dioxide | 0 | 0 | 0 | 0 | 0 | 0 | 10 |

| Inventive pastes | P8 | P9 | P10 | P11 | P12 | P13 |
|---|---|---|---|---|---|---|
| Silver particles | 75 | 80 | 70 | 75 | 80 | 70 |
| α-Terpineol | 14.8 | 14.8 | 14.8 | 14.8 | 14.8 | 14.8 |
| Ethylcellulose | 0.2 | 0.2 | 0.2 | 0.2 | 0.2 | 0.2 |
| Molybdenum | 10 | 5 | 15 | 0 | 0 | 0 |
| Silver-coated nickel particles | 0 | 0 | 0 | 10 | 5 | 15 |

Silver particles: silver flakes with d50 = 4 μm coated with 0.6% by weight of a fatty acid mixture (lauric acid/stearic acid at a weight ratio of 25:75)
Aluminium oxide: Particles with d50 = 2.5 μm
Tungsten: Particles with d50 = 1.5 μm
Aluminium nitride: Particles with d50 = 1.5 μm
Titanium dioxide: Particles with d50 = 3 μm
Molybdenum: Particles with d50 = 2.1 μm
Silver-coated nickel particles: Nickel core-silver jacket particles (weight ratio of silver: nickel = 75:25) with d50 = 5 μm

2. Application and Sintering of the Metal Pastes a) Production of free sintering layers for determination of the modulus of elasticity and for determination of the curvature The specific metal paste was applied by stencil printing onto the copper oxide surface of a copper foil at a wet layer thickness of 150 μm. The printed surface in each case was the full surface of a rectangle having dimensions of 2.5 cm·1.0 cm. Subsequently, the applied metal paste was dried (30 min. at 120° C. in a circulating air drying oven) and sintered for 2 minutes at 250° C. and a pressure of 4 MPa. The layer thickness after sintering was 100 μm. The sintered metal layers were detached from the oxidised copper foil for the subsequent tests.

b) Production of samples for determination of the shear strength. The specific metal paste was applied by stencil printing onto the entire surface area of 4 mm·4 mm of a DCB substrate at a wet layer thickness of 75 μm. The sample was then dried for 30 min at 120° C. in a circulating air drying oven. Silicon chips were placed on the dried pastes by their silver contact surface of 4 mm·4 mm at a temperature of 150° C. The silicon chips were heated for 2 min. at 4 MPa and 250° C. in order to sinter the components to the DCB.

After the sintering, the bonding was determined by testing the shear strength. In this context, the silicon chips were sheared off with a shearing chisel at a rate of 0.3 mm/s at 260° C. The force was measured by means of a load cell (DAGE 2000 device made by DAGE, Germany).

The modulus of elasticity and the curvature of the free sintering layers were determined by means of a bending test without or after a long-term temperature stress at 200° C. for 100 hours, in each case following the procedure illustrated above. The following table shows the measuring results obtained:

| Paste | Modulus of elasticity [GPa] | Modulus of elasticity after long-term temperature stress [GPa] | Curvature after long-term temperature stress | Shear test [N/mm$^2$] |
| --- | --- | --- | --- | --- |
| P1 | 14 | 80 | >1 mm | 23 |
| P2 | 14 | 35 | >1 mm | 8 |
| P3 | 30 | 30 | >1 mm | 20 |
| P4 | 12 | 30 | >1 mm | 15 |
| P5 | 16 | 34 | >1 mm | 15 |
| P6 | 10 | 28 | >1 mm | 12 |
| P7 | 15 | 25 | >1 mm | 9 |
| P8 | 15 | 17 | <50 μm | 14 |
| P9 | 17 | 19 | <50 μm | 17 |
| P10 | 10 | 12 | <50 μm | 10 |
| P11 | 18 | 40 | <50 μm | 18 |
| P12 | 16 | 43 | <50 μm | 16 |
| P13 | 10 | 30 | <50 μm | 12 |

The invention claimed is:

1. A metal sintering paste comprising:
   (A) 70 to 90% by weight copper and/or silver particles that comprise a coating that contains at least one organic compound,
   (B) 5 to 20% by weight organic solvent, and
   (C) 2 to 20% by weight of at least one type of metal particles that are different from particles (A) and have a mean particle size (d50) in the range of 0.2 to 10 μm,
   wherein the metal particles of component (C) are nickel core-silver jacket particles with a silver content of 15 to 30% by weight.

2. The metal sintering paste of claim 1, wherein the copper and/or silver particles (A) take the shape of flakes.

3. The metal sintering paste of claim 1, wherein the at least one organic compound is selected from the group consisting of free fatty acids, fatty acid salts, and fatty acid esters.

4. The metal sintering paste of claim 1, wherein the nickel core-silver jacket particles have a silver content of 25% by weight.

5. The metal sintering paste of claim 1, wherein the particles (C) comprise neither flakes nor needles.

6. The metal sintering paste of claim 5, wherein the particles (C) comprise a shape factor in the range of 1 to 3.

7. The metal sintering paste of claim 1, further comprising up to 12% by weight of at least one metal precursor (D), 0 to 10% by weight of at least one sintering aid (E), and 0 to 15% by weight of one or more further ingredients (F) selected from dispersion agents, surfactants, de-foaming agents, binding agents, polymers and/or viscosity-controlling (rheological) agents.

8. The metal sintering paste of claim 1, wherein the paste comprises 70 to 80% by weight of the copper and/or silver particles.

9. The metal sintering paste of claim 1, further comprising up to 12% by weight of at least one metal precursor (D).

10. The metal sintering paste of claim 1, further comprising up to 10% by weight of at least one sintering aid (E).

11. The metal sintering paste of claim 1, further comprising up to 15% by weight of one or more further ingredients (F) selected from dispersion agents, surfactants, de-foaming agents, binding agents, polymers and/or viscosity-controlling (rheological) agents.

12. The metal sintering paste of claim 11, wherein the one or more further ingredients (F) is a polymer, the polymer being a cellulose derivative.

13. The metal sintering paste of claim 12, wherein the cellulose derivative is ethylcellulose.

* * * * *